United States Patent
Do et al.

(10) Patent No.: US 7,858,442 B2
(45) Date of Patent: Dec. 28, 2010

(54) LEADED STACKED PACKAGES HAVING ELEVATED DIE PADDLE

(75) Inventors: Byung Tai Do, Singapore (SG); Francis Heap Hoe Kuan, Singapore (SG); Seng Guan Chow, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 163 days.

(21) Appl. No.: 12/353,020

(22) Filed: Jan. 13, 2009

(65) Prior Publication Data

US 2009/0142883 A1 Jun. 4, 2009

Related U.S. Application Data

(62) Division of application No. 11/459,557, filed on Jul. 24, 2006, now Pat. No. 7,495,321.

(51) Int. Cl.
 *H01L 23/12* (2006.01)
(52) U.S. Cl. ............... 438/109; 438/123; 257/E23.023
(58) Field of Classification Search ........... 438/106, 438/109, 110, 123; 257/E23.023, E23.129, 257/E23.021, E23.003
See application file for complete search history.

(56) References Cited

U.S. PATENT DOCUMENTS

| 5,012,323 A | 4/1991 | Farnworth |
| 5,633,528 A | 5/1997 | Abbott et al. |
| 5,777,345 A | 7/1998 | Loder et al. |
| 2004/0108585 A1 | 6/2004 | Hetzel et al. |

FOREIGN PATENT DOCUMENTS

| DE | 4041224 | 7/1992 |
| EP | 0515094 A1 | 5/1992 |
| EP | 1396886 A3 | 7/2004 |

*Primary Examiner*—Roy K Potter
(74) *Attorney, Agent, or Firm*—Robert D. Atkins

(57) ABSTRACT

A semiconductor package includes a leadframe, an elevated die paddle disposed above the leadframe, a first die attached to a lower surface of the elevated die paddle to support the first die within the semiconductor package, and a second die attached to the first die. A method of manufacturing a semiconductor package includes providing a leadframe having a lower lead and an elevated die paddle structure, attaching a first die to the elevated die paddle structure with a die adhesive (DA) for supporting the first die within the semiconductor package, and wire bonding the first die to the lower lead.

21 Claims, 8 Drawing Sheets

LEADED STACKED PACKAGES HAVING ELEVATED DIE PADDLE

The present application is a division of, claims priority to, and fully incorporates herein by reference U.S. patent application Ser. No. 11/459,557 filed Jul. 24, 2006.

FIELD OF THE INVENTION

The present invention relates in general to semiconductor devices and, more particularly, to multi-chip semiconductor packages that have stacked dies.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As the demand for semiconductor devices with low-cost, high performance, increased miniaturization, and greater packaging densities has increased, Multi-Chip Module (MCM) structures have been developed to meet the demand. MCM structures have a number of dies and other semiconductor components mounted within a single semiconductor package. The number of dies and other components can be mounted in a vertical manner, a lateral manner, or combinations thereof.

One such approach is to stack one die on top of another and then enclose the stack of dies in one package. The final package for a semiconductor with stacked dies is much smaller than would result if the dies were each packaged separately. In addition to providing a smaller size, stacked-die packages offer a number of advantages that relate to the manufacturing of the package, such as ease of handling and assembly.

In a stacked-die arrangement, the dies are wire-bonded sequentially, typically with automated wire-bonding equipment employing well-known thermal compression or ultrasonic wire-bonding techniques. During the wire-bonding process, the head of a wire-bonding apparatus applies a downward pressure on a conductive wire held in contact with a wire-bonding pad on the die to weld, or bond, the wire to the bonding pad on the die.

In many cases, stacked-die semiconductors can be fabricated faster and more cheaply than several semiconductors, each having a single die, which perform the same functions. A stacked-die approach is advantageous because of the increase in circuit density achieved.

Despite efforts to overcome problems resulting in lower yields of semiconductor packages with stacked dies, problems still exist. In particular, dies within the stack fail prematurely. Additionally, at least one die often overlies a plurality of other active or passive components, making designing of such semiconductor packages more difficult. Furthermore, the layout of bonding pads on the substrate is difficult, resulting in bonding wires of various lengths being used. The placement, as well as the parasitic inductance and parasitic capacitance of various-length bonding wires, needs to be taken into account during the design of the semiconductor package.

An upper die can crack during wire-bonding of the upper die due to lack of vertical support if the upper die overhangs the next lower die in the stack of dies. Consequently, smaller dies usually are placed on top of larger dies in semiconductor packages having stacked dies. Heat dissipation in semiconductor packages having multiple dies is a problem. The more dies that are placed in a semiconductor package, the greater the problem with heat dissipation.

The presence of multiple dies in a semiconductor package causes problems with the flow of the molding compound used to encapsulate the dies in forming the semiconductor package. There is also a problem with designing suitable electrical ground paths to the dies in a stacked-die semiconductor package.

When multiple dies are stacked in a semiconductor package, more adhesive material is used in the semiconductor package. Adhesive materials have the tendency to absorb moisture, which can have adverse effects on the dies, reducing the reliability and useful life of the semiconductor package. Furthermore, there is a thermal mismatch between the materials used to position the stacked dies in the semiconductor package and the substrate. The resulting relative motion of the dies with respect to the substrate has an adverse effect on the reliability of solder balls used to connect the dies to the substrate.

A need exists for a stacked-die arrangement which addresses the problems previously described, yet is efficient and cost-effective to manufacture.

SUMMARY OF THE INVENTION

In one embodiment, the present invention is a semiconductor package comprising a leadframe, an elevated die paddle disposed above the leadframe, a first die attached to a lower surface of the elevated die paddle to support the first die within the semiconductor package, and a second die attached to the first die.

In another embodiment, the present invention is a method of manufacturing a semiconductor package comprising providing a leadframe having a lower lead and an elevated die paddle structure, attaching a first die to the elevated die paddle structure with a die adhesive (DA) for supporting the first die within the semiconductor package, and wire bonding the first die to the lower lead.

In still another embodiment, the present invention is a semiconductor package comprising a leadframe having an elevated die paddle disposed above the leadframe, first and second dies electrically connected by a ball grid array (BGA), the first die attached to the elevated die paddle for structural support, and an underfill material disposed between the first and second dies.

In yet another embodiment, the present invention is a method of manufacturing a semiconductor package comprising providing a leadframe having a lower lead and an elevated die paddle structure, attaching a first die to a second die, the first die attached to a plurality of dies in a wafer form, singulating the first die from the plurality of dies, and attaching the first die to the elevated die paddle structure with a die adhesive (DA).

BRIEF DESCRIPTION OF THE DRAWINGS

FIG. 4b illustrates a first cross-sectional view of the leadframe structure depicted in FIG. 4a;

FIG. 4c illustrates a second cross-sectional view of the leadframe structure depicted in FIG. 4a;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A semiconductor package can be manufactured which takes into account a stacked-die arrangement and serves to alleviate many of the problems previously described, while providing increasingly smaller sizes. The package can be manufactured more easily and with greater efficiency than previous packages, resulting in a package with lower overall manufacturing cost.

The semiconductor packages described below reduce incidences of upper die cracking during wire bonding of the upper die, which provides additional freedom in the design and location of various sized dies in semiconductor packages having stacked dies. Additionally, the packages alleviate problems associated with heat dissipation in semiconductor packages having multiple dies, which allows more dies to be placed in a given semiconductor package.

The semiconductor packages described serve to reduce the amount of adhesive material used when multiple dies are stacked, resulting in a reduction in the amount of moisture that can be absorbed into the package. Finally, the reliability of semiconductor packages having stacked dies is increased by use of the following designs and methods of manufacture.

Figure 1A:
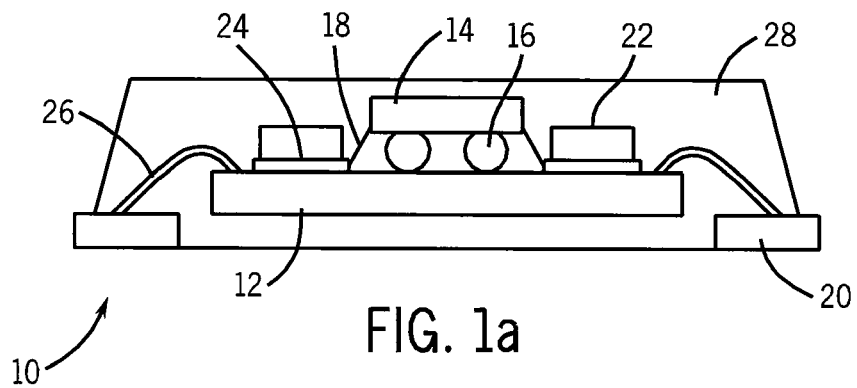
FIG. 1a illustrates a semiconductor package with a stacked-die arrangement.

Turning to FIG. 1a, a semiconductor package 10 with a stacked-die arrangement is illustrated. Package 10 includes a first die 12, and a second die 14 which is connected by a ball grid array (BGA) 16. Use of BGA 16 reduces upper die cracking during wire bonding partly due to the stability of the BGA. BGA 16 can be manufactured using techniques generally known in the art. An underfill material 18 is disposed between a top surface of die 12 and a bottom surface of die 14 to provide structural support. Package 10 also includes a lower lead structure 20 disposed beneath an elevated die paddle structure 22. Elevated die paddle 22 and lower lead 20 are integrated into a lead frame assembly as will be later described. A die attach (DA) adhesive 24 bonds die 12 to elevated die paddle 22. Wire bonds 26 are seen providing electrical conductivity between die 12 and the lower lead structure 20.

An encapsulant 28 is formed over dies 12, 14 and at least a portion of lead 20 and elevated die paddle 22 to provide structural support, resulting in the completed package 10. Wire bonding 26, DA adhesive 24 and encapsulant 28 can consist of a variety of materials. The manufacturing techniques involving bonds 26, adhesive 24 and encapsulant 28 can include those generally known in the art and selected for a particular application.

Figure 1B:
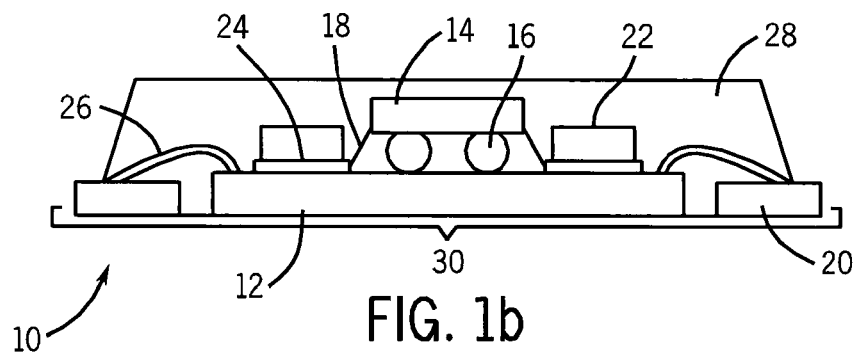
FIG. 1b illustrates an additional embodiment of a semiconductor package with a stacked-die arrangement, the arrangement having an exposed die.

FIG. 1b illustrates an additional embodiment of a semiconductor package with a stacked-die arrangement. Again, dies 12 and 14, BGA 16, underfill 18, lower lead 20, elevated die paddle 22, die adhesive 24, wire bond 26, and encapsulant 28 are depicted. Elevated die paddle 22 and lower lead 20 are adapted to allow die 12 to sit horizontally parallel between leads 20 as shown. Encapsulant 28 is formed over a portion of die 12 and leads 20 to allow for a bottom surface 30 where surface 30 exposes die 12 for a particular application.

Figure 1C:
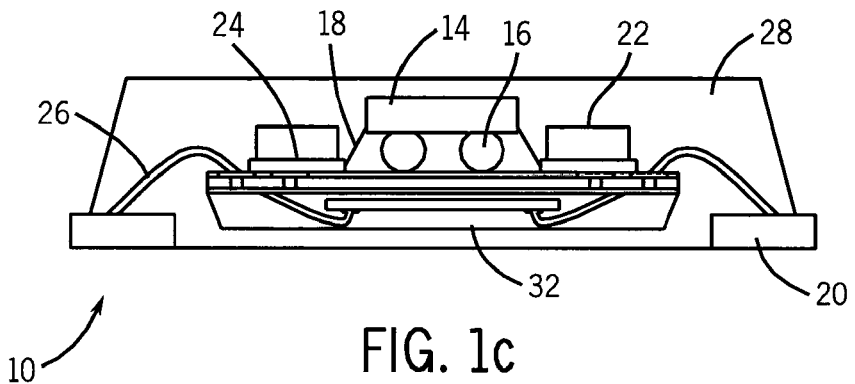
FIG. 1c illustrates an additional embodiment of a semiconductor package with a stacked-die arrangement.

FIG. 1c illustrates an additional embodiment of a semiconductor package with a stacked-die arrangement. A semiconductor package 32 replaces die 12. Package 32 can include such internal stacking modules (ISMs) as land grid arrays (LGAs) or quad flat nonleaded (QFN) package structures. Again, encapsulant 28 is formed around package 32 and die 14 for structural support.

Figure 1D:
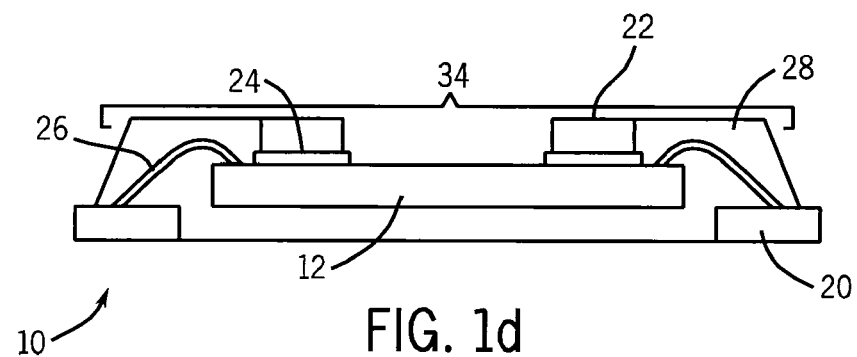
FIG. 1d illustrates a semiconductor package for a stacked-die arrangement having an exposed elevated die paddle structure which is configured to receive an additional semiconductor package with either a wire-bondable die or flip chip die.

FIG. 1d illustrates a semiconductor package 10 having a partially exposed die 12 which is configured to receive an additional semiconductor package 10. The semiconductor package 10 can include either a wire-bondable die 12 or a flip chip die 12. Encapsulant 28 is formed to render surface 34 as depicted, which exposes a top surface of elevated die paddle 22 which can be utilized for further manufacturing.

Figure 1E:
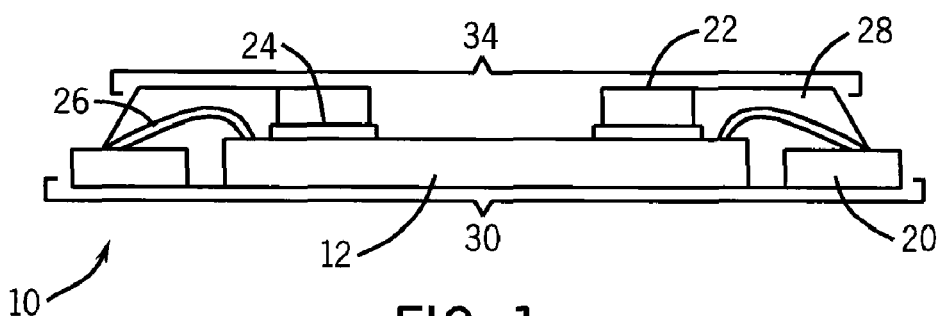
FIG. 1e illustrates a semiconductor package having exposed upper and lower portions.
Figure 1F:
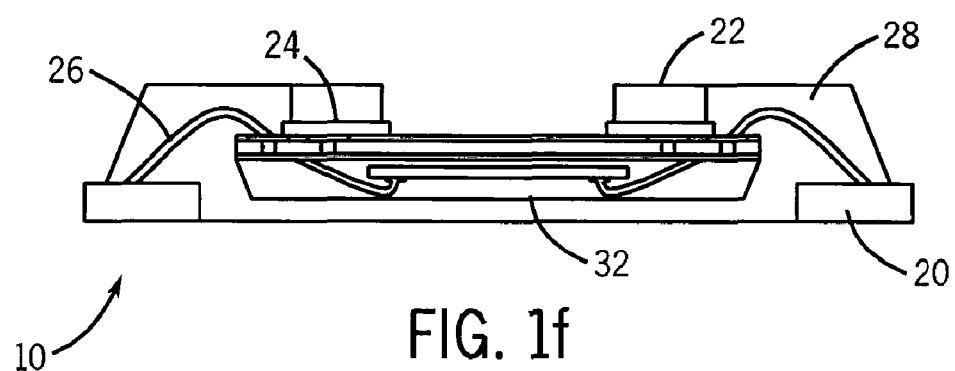
FIG. 1f illustrates an additional embodiment of a semiconductor package for a stacked-die arrangement.

FIG. 1e illustrates a semiconductor package 10 having exposed upper and lower portions. Again, lower leads 20 are adapted to allow die 12 to rest parallel to leads 20. Encapsulant 28 forms surfaces 30, 34 to expose a bottom surface of die 12 and an upper surface of elevated die paddle 22. The embodiment shown in FIG. 1e provides an extremely small size package 10 for a particular application, or for use in further manufacturing. FIG. 1f illustrates an additional embodiment of a semiconductor package for a stacked-die arrangement. Package 10 as depicted in FIG. 1d includes die 12 replaced with a package 32 for a particular application.

Figure 1G:
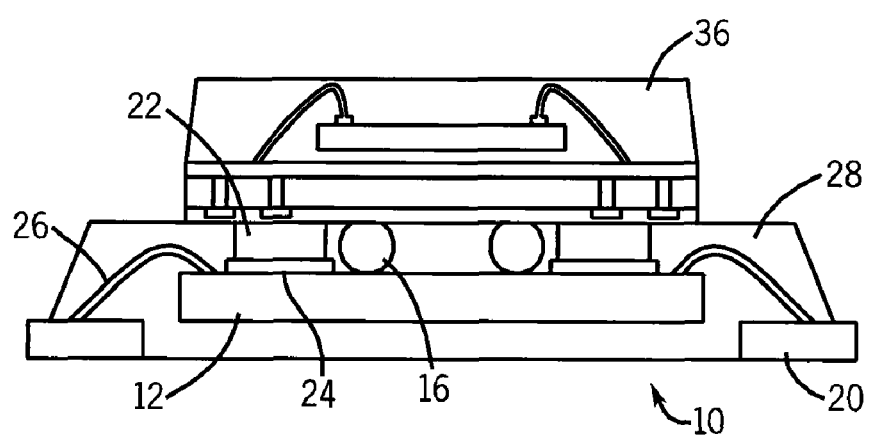
FIG. 1g illustrates an additional embodiment of a semiconductor package adapted for a package-on-package (PoP) arrangement.

FIG. 1g illustrates an additional embodiment of a semiconductor package adapted for a package-on-package (PoP) arrangement. Again, as previously described, and as depicted in FIG. 1d, package 10 with an exposed elevated die paddle structure 22 can be adapted to receive PoP 36. BGA 16 provides electrical conductivity to PoP 36. PoP 36 can include a leaded package, an array package, a flip chip die, or a passive component. Package 10 as depicted in FIG. 1d provides a generic structure which can easily be configured to accommodate a variety of PoP options.

Figure 2A:
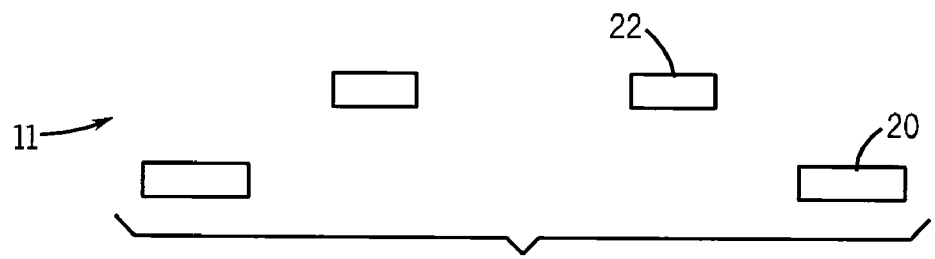
FIG. 2a illustrates a first step in a first example method of manufacturing a semiconductor package for a stacked-die arrangement.
Figure 2B:
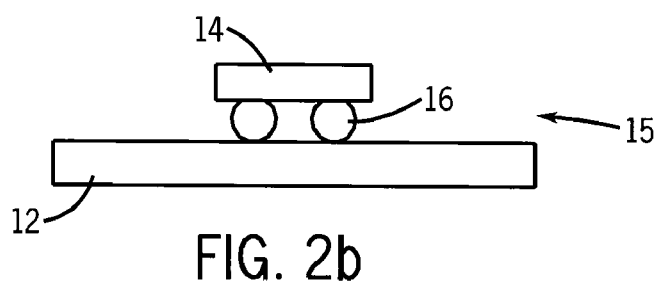
FIG. 2b illustrates a second step in a first example method of manufacturing a semiconductor package for a stacked-die arrangement.
Figure 2C:
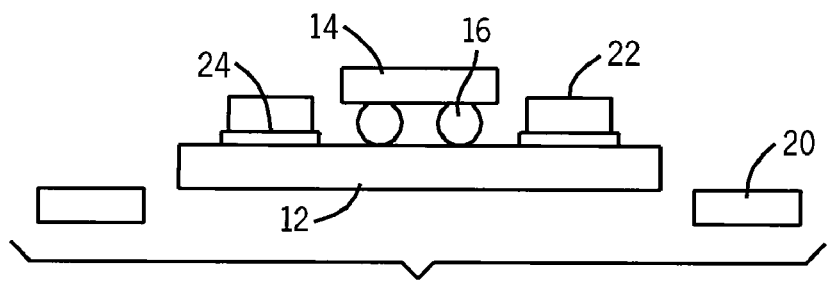
FIG. 2c illustrates a third step in a first example method of manufacturing a semiconductor package for a stacked-die arrangement.
Figure 2D:
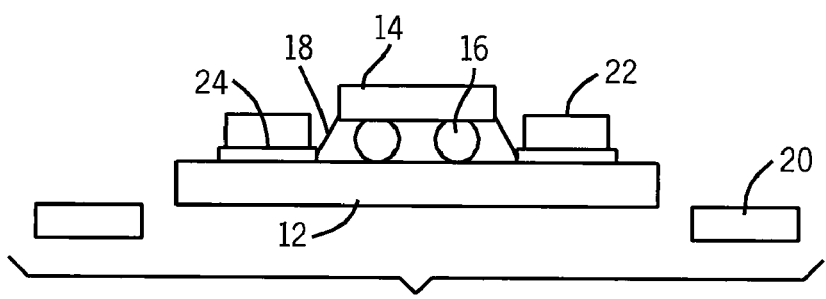
FIG. 2d illustrates a fourth step in a first example method of manufacturing a semiconductor package for a stacked-die arrangement.
Figure 2E:
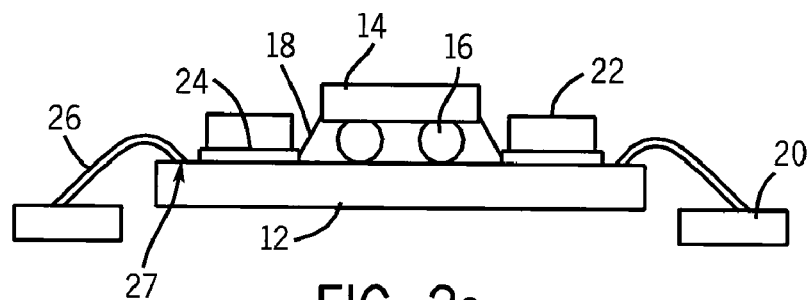
FIG. 2e illustrates a fifth step in a first example method of manufacturing a semiconductor package for a stacked-die arrangement.
Figure 2F:
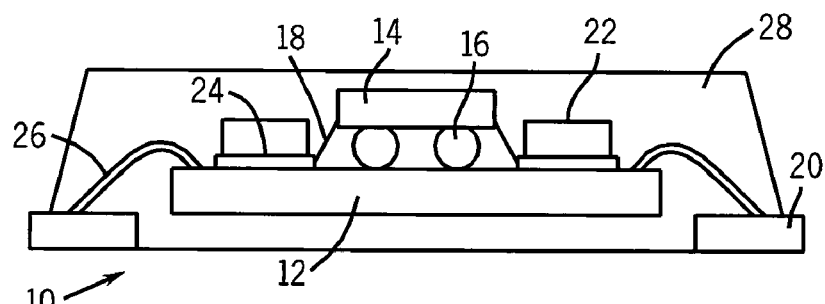
FIG. 2f illustrates a sixth step in a first example method of manufacturing a semiconductor package for a stacked-die arrangement.

FIG. 2a illustrates a first step in a first example method of manufacturing a semiconductor package for a stacked-die arrangement. A leadframe 11 is prepared which includes lower lead structures 20 as well as elevated die paddle structures 22. FIG. 2b illustrates a next step in the method of manufacturing. Die 12 is connected to die 14 using BGA 16 while die 12 exists as a plurality of dies in unsingulated wafer form. Accordingly, a plurality of singulated dies 14 can be connected to a plurality of dies 12 in wafer form. FIG. 2c illustrates a next step in the method of manufacturing. Dies 12 and 14 are connected to elevated die paddle 22 using a die attach (DA) adhesive 24 as shown. FIG. 2d illustrates a next step in the method of manufacturing, depicting an underfill material 18 deposited between dies 12 and 14, and surrounding and protecting BGA 16. Elevated die paddle 22 can act as a dam to prevent the underfill material 18 from flowing to a wire bond pad located at the periphery of the top surface of die 12. As a next step in the method, FIG. 2e illustrates wire bonding 26 between lower leads 20 and wire bond pad 27. Finally, FIG. 2f illustrates a last step in the first example method of manufacturing a semiconductor package for a stacked-die arrangement, showing an encapsulant 28 which is molded over dies 12, 14, elevated die paddle 22, and a portion of lower lead 20, forming a completed package 10.

Figure 3A:
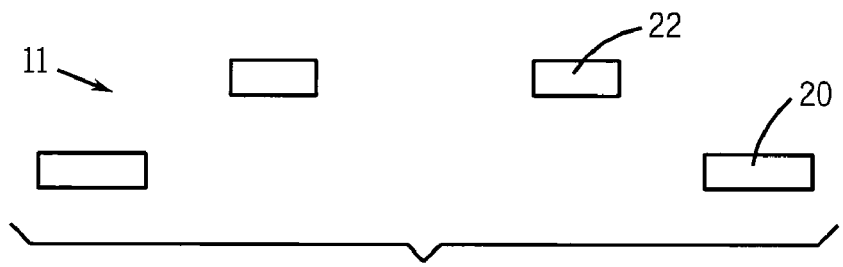
FIG. 3a illustrates a first step in a second example method of manufacturing a semiconductor package for a stacked-die arrangement.
Figure 3B:
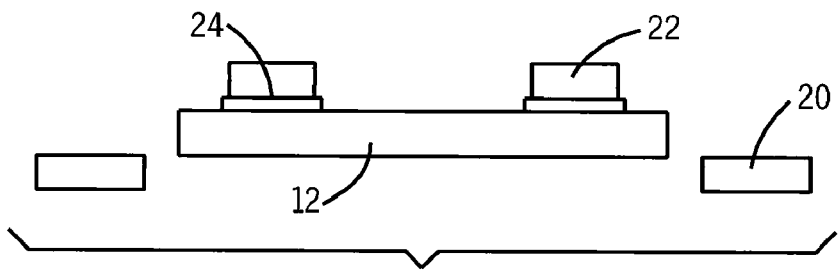
FIG. 3b illustrates a second step in a second example method of manufacturing a semiconductor package for a stacked-die arrangement.
Figure 3C:
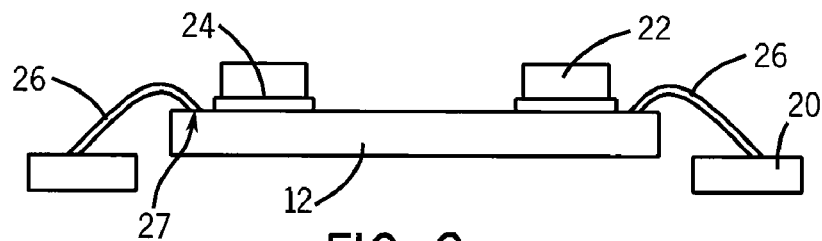
FIG. 3c illustrates a third step in a second example method of manufacturing a semiconductor package for a stacked-die arrangement.
Figure 3D:
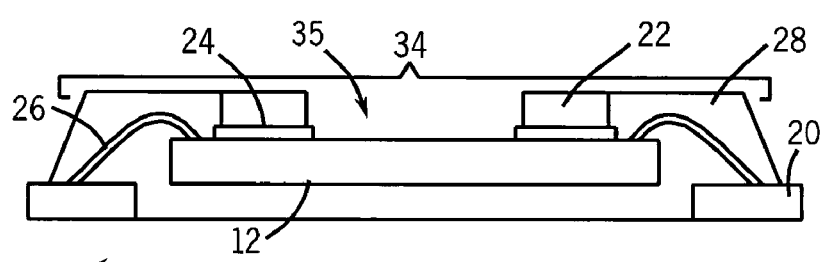
FIG. 3d illustrates a fourth step in a second example method of manufacturing a semiconductor package for a stacked-die arrangement.

FIG. 3a illustrates a first step in a second example method of manufacturing a semiconductor package for a stacked-die arrangement. Again, as a first step, a leadframe 11 is prepared having an elevated die paddle structure 22 and lower leads 20. FIG. 3b illustrates a second step in the method of manufacturing, depicting die 12 attached to elevated die paddles 22 using DA adhesive 24. As a next step, FIG. 3c illustrates wire bonds 26 deposited between wire bond pad 27 and lower leads 20. As a next step, FIG. 3d illustrates forming an encapsulant 28 over a portion of die 12 to leave an exposed surface 34 and an open cavity 35. The semiconductor package 10 as completed thus far can then be pre-tested before an additional package, such as package 36, is mounted on top of the exposed elevated die paddle 22. Again, packages such as package 36 can be mounted to the die 12 through a cavity 35 (refer to FIG. 3d) defined by the exposed elevated die paddle 22, or a host of additional active or passive devices can be mounted to the exposed die 12 through the open cavity 35 defined by the elevated die paddle 22.

Figure 4A:
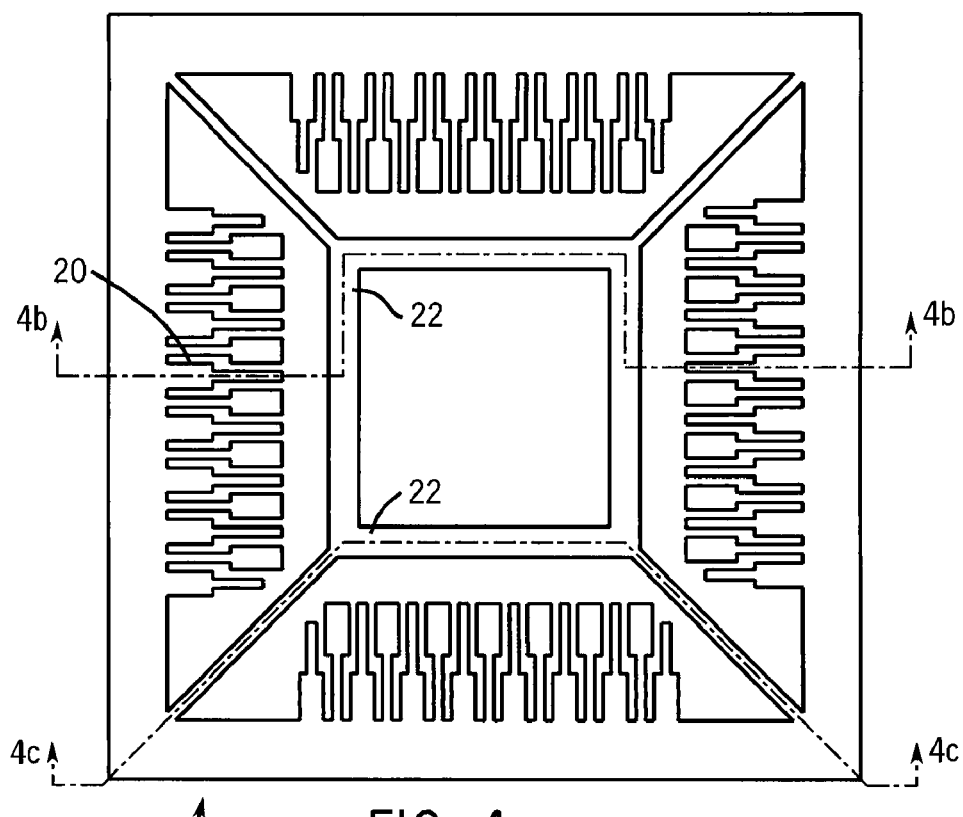
FIG. 4a illustrates a top view of a portion of a leadframe structure in an example embodiment.
Figure 4B:
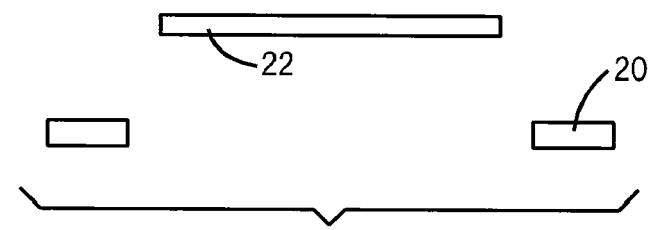
Figure 4C:
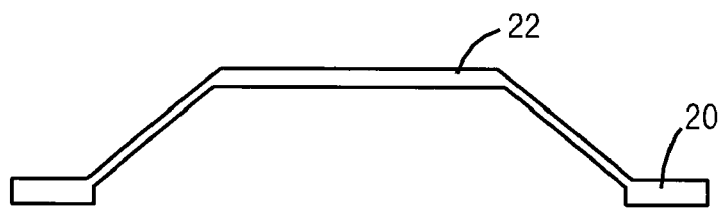

Turning to FIG. 4a, a top view of a portion of a leadframe structure 11 is depicted in an example embodiment in accordance with FIGS. 2a and 3a. Leadframe 11 shows cross sections 4b and 4c as depicted. Elevated die paddle 22 and lower leads 20 are shown. FIG. 4b illustrates a first cross-sectional view of the leadframe 11 structure depicted in FIG. 4a taken along dotted line 4a. Again, elevated die paddle 22 and lower leads 20 are depicted. FIG. 4c illustrates a second cross-sectional view of the leadframe structure depicted in FIG. 4a taken along dotted line 4b. Elevated die paddle 22 and lower leads 20 are shown, again in accordance with figures which have been previously described.

Figure 5A:
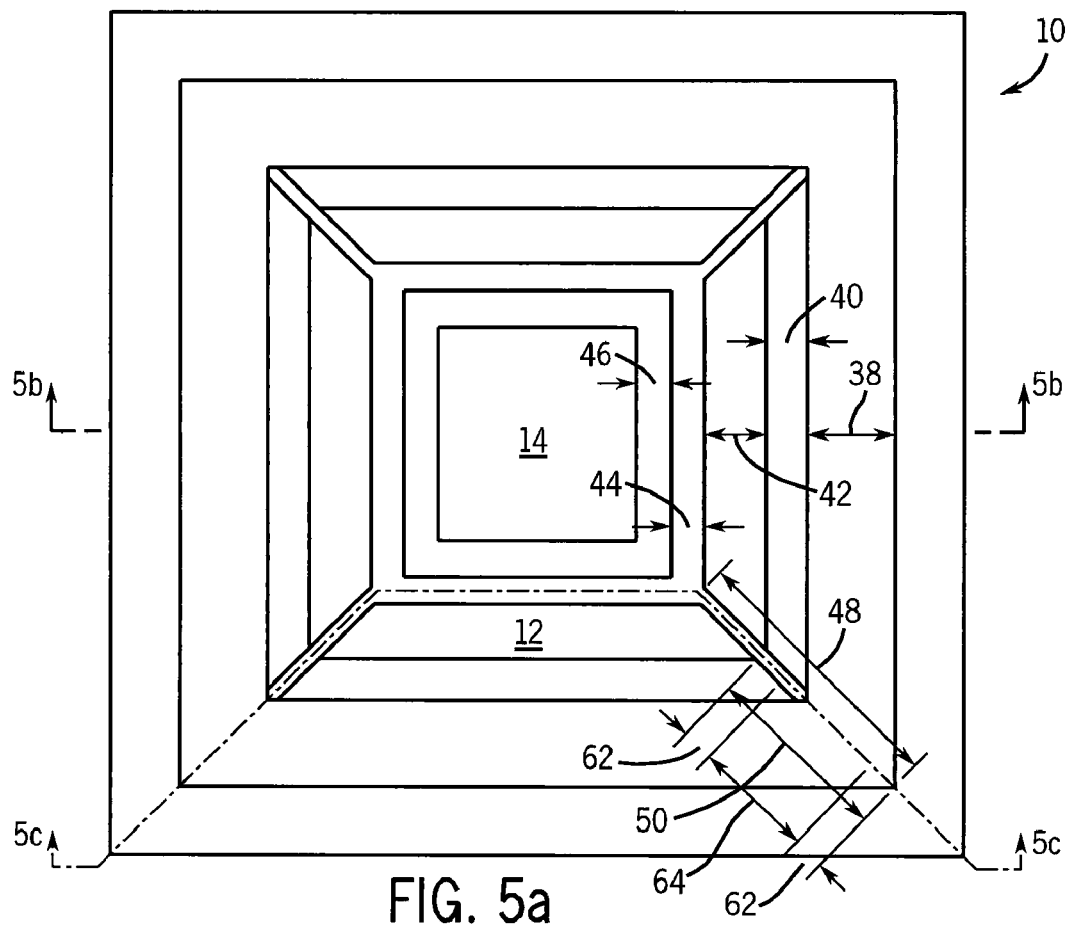
FIG. 5a illustrates various example dimensions of a top view of a stacked-die semiconductor package.

FIG. 5a illustrates various example dimensions of a top view of a stacked-die semiconductor package 10. Dies 12 and 14 are again shown for purposes of reference. In one embodiment, a minimum package 10 size is recommended to be 7×7 millimeters (mm). Correspondingly, a maximum die size for die 14 is recommended to be 5.2×5.2 mm for a 9×9 mm package 10, and 3.2×3.2 mm for the minimum 7×7 mm package 10. In the embodiment shown in FIG. 5a, widths 38, 40, 42, 44, and 46 are 26 mils, 10 mils, 13, mils, 12, mils and 15 mils, respectively, totaling 76 mils (1.93 mm) in width. Width 48 equals roughly the same width of 76 mils (1.93 mm). Width 50 is roughly 50 mils (1.27 mm). Width 62 is approximately 12 mils, which is the allowance from the die and leadframe edge to the start of upset bending. Finally, width 64 is approximately 26 mils (0.66 mm).

Figure 5B:
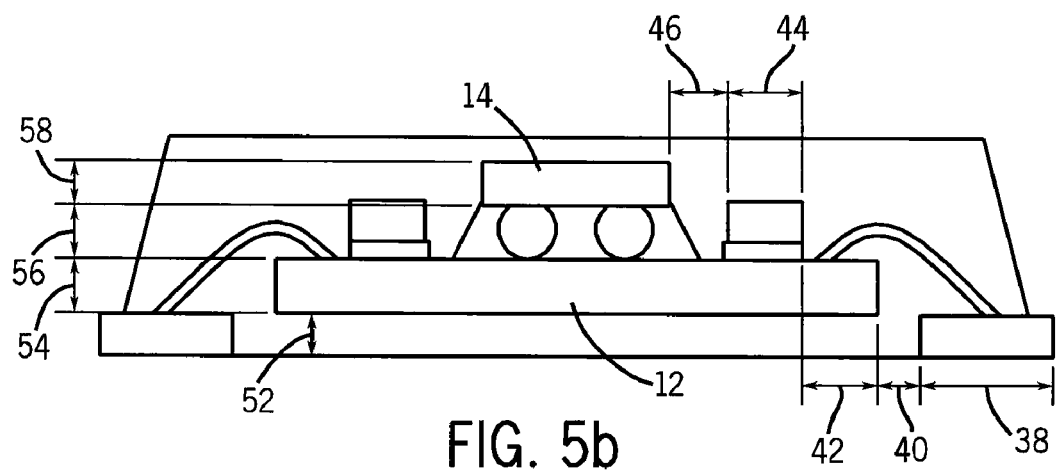
FIG. 5b illustrates various example dimensions of a first cross-sectional view of a stacked-die semiconductor package.

FIG. 5b illustrates various example dimensions of a first cross-sectional view of the stacked-die semiconductor package depicted in FIG. 5a taken along dotted line 5b. Here, heights 52, 54, 56, and 58 are approximately 6 mils, 8 mils, 4 mils, and 8 mils for a total height of 26 mils (again 0.66 mm). Package 10, as a result, can achieve an extremely small height footprint. The height taken from a bottom surface of die 12 to a top surface of die 14, taking into account BGA 16 and underfill material 18, is approximately 20 mils (0.50 mm). The ability of die 14 to rest inside elevated die paddles 22 serves to decrease the overall height footprint of package 10. Again, widths 38, 40, 42, 44, and 46 are seen, corresponding to widths 38, 40, 42, 44, and 46 depicted in FIG. 5a.

Figure 5C:
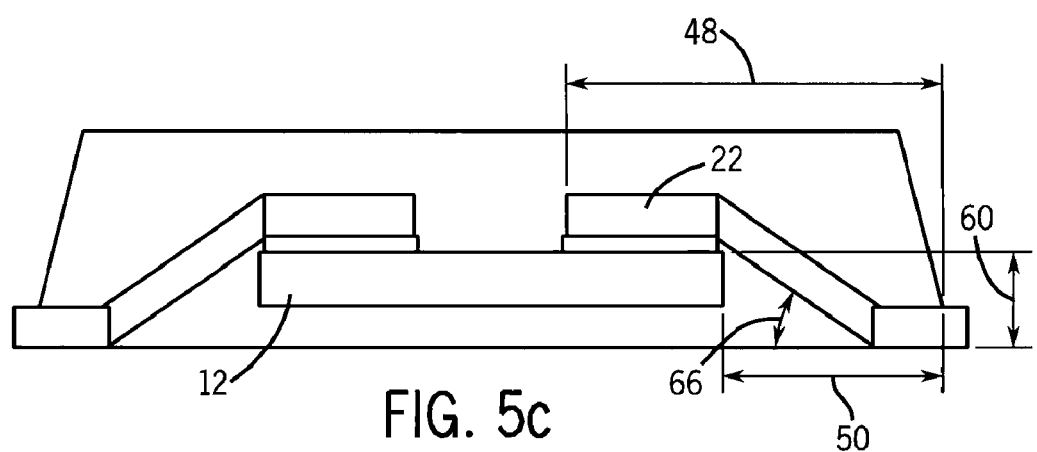
FIG. 5c illustrates various example dimensions of a second cross-sectional view of a stacked-die semiconductor package.

FIG. 5c illustrates various example dimensions of a second cross-sectional view of the stacked-die semiconductor package depicted in FIG. 5a taken along dotted line 5c. Here, width 48, corresponding to approximately 76 mils (1.93 mm), is again depicted, as well as width 50, again corresponding to 50 mils (1.27 mm). A height 60 taken from a bottom surface of package 10 to a bottom surface of elevated die paddle 22 is approximately 15 mils (0.38 mm), which again demonstrates a small height footprint. In the embodiment shown, elevated die paddle 22 makes an angle 66 of 30 degrees from horizontal.

Figure 6:
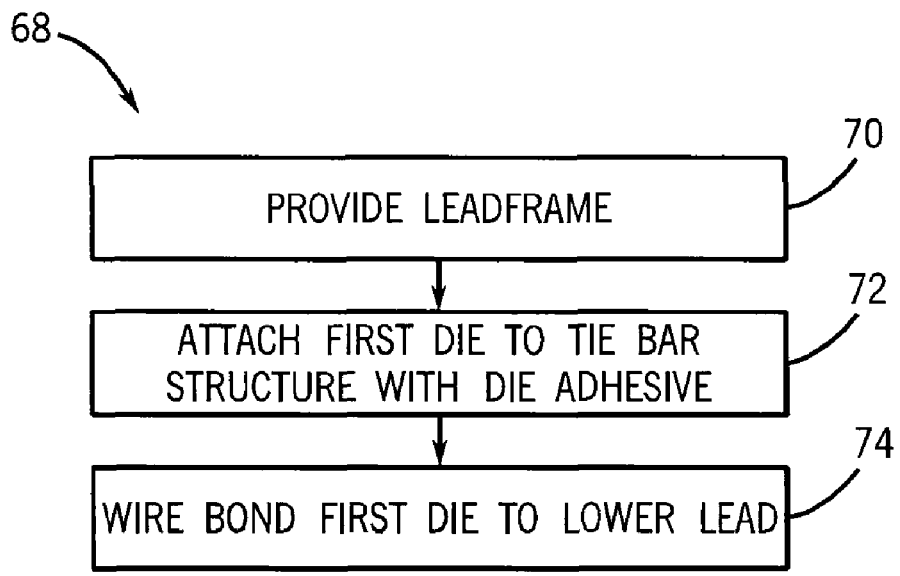
FIG. 6 illustrates a first example method of assembling a stacked-die package in flow chart form.

FIG. 6 illustrates a first example method 68 of assembling a stacked-die package 10 in flowchart form. A leadframe is provided (step 70). Next, a first die is attached to an elevated die paddle structure with die attach (DA) adhesive (step 72). Finally, the first die is wire bonded to a lower lead (step 74).

Figure 7:
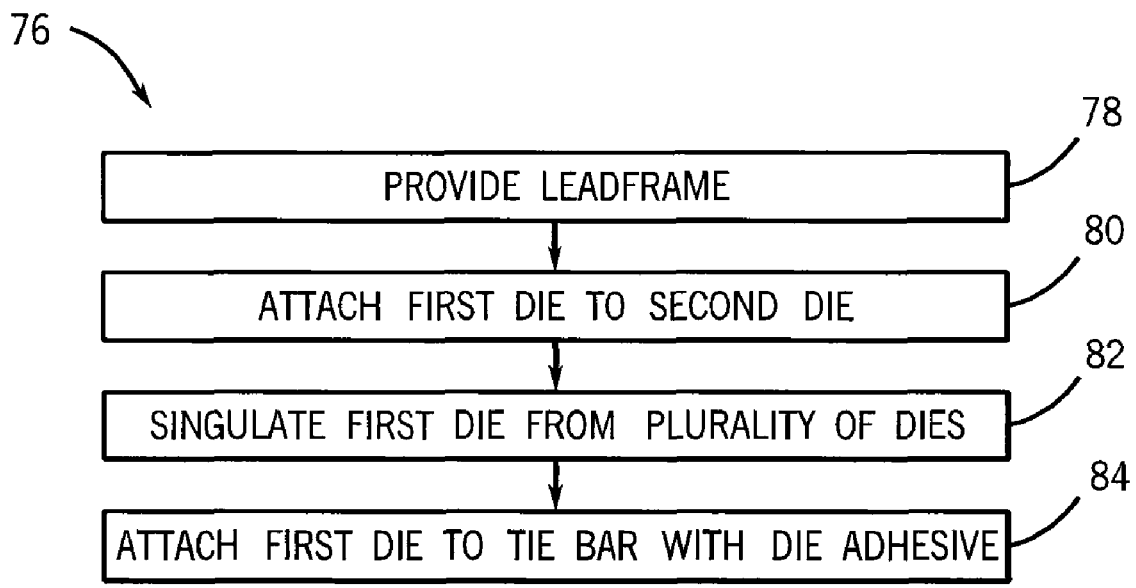
FIG. 7 illustrates a second example method of assembling a stacked-die package in flow chart form.

FIG. 7 illustrates a second example method 76 of assembling a stacked-die package 10 in flowchart form. A leadframe is again provided (step 78). Next, a first die is attached to a second die (step 80). The first die is singulated from a plurality of dies (step 82). Finally the first die is attached to an elevated die paddle with die attach (DA) adhesive (step 84).

The use of package 10 involves new stacking concepts suitable for a leadframe package. As the cost of leaded packages is much lower than the costs associated with an array package, the use of package 10 is less expensive, yet the needs for higher functionality and device density of new generation packages are not compromised.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor package, comprising:
   providing a leadframe;
   providing a die paddle which is elevated above the leadframe, the die paddle having an opening formed through a central area of the die paddle;
   mounting a first die to the die paddle over the opening to support the first die within the semiconductor package;
   mounting a second die within the opening; and
   electrically connecting the first die to the second die.

2. The method of claim 1, further including forming an encapsulant over a portion of first die and die paddle.

3. The method of claim 1, further including electrically connecting the first die to the second die with a ball grid array or wire bond.

4. The method of claim 1, further including disposing an underfill material between the first die and second die for structural support.

5. The method of claim 1, wherein the second die includes a leaded package, nonleaded package, array package, flip chip die, or passive component.

6. A method of making a semiconductor package, comprising:
   providing a leadframe having an elevated die paddle disposed above the leadframe;
   mounting a first die to the elevated die paddle for structural support;
   electrically connecting a second die to the first die; and
   disposing an underfill material between the first die and second die.

7. The method of claim 6, further including forming an encapsulant over a portion of the first die for structural support.

8. The method of claim 6, further including mounting the first die to the elevated die paddle with a die adhesive.

9. The method of claim 6, wherein the second die includes a leaded package, nonleaded package, array package, flip chip die, or passive component.

10. A method of making a semiconductor package, comprising:
    providing a leadframe disposed in a first plane;
    providing a die paddle which is elevated above the leadframe in a second plane which is parallel to the first plane;
    providing a plurality of die paddle supports coupled between the leadframe and die paddle;
    mounting a first die to the die paddle to support the first die within the semiconductor package; and
    attaching a second die to the first die.

11. The method of claim 10, further including forming an encapsulant over a portion of first die and die paddle.

12. The method of claim 10, further including disposing an underfill material between the first die and second die for structural support.

13. The method of claim 10, wherein the second die includes a leaded package, nonleaded package, array package, flip chip die, or passive component.

14. The method of claim 10, further including forming an opening through the central area of the die paddle, the first die being mounted over the opening to support the first die within the semiconductor package, the second die being disposed within the opening.

15. The method of claim 14, further including mounting the second die within the opening using a ball grid array or wire bond.

16. A method of making a semiconductor package, comprising:
    providing a leadframe disposed in a first plane;
    providing an elevated die paddle disposed above the leadframe in a second plane which is parallel to the first plane;
    mounting a first surface of a first die to the elevated die paddle to support the first die within the semiconductor package, the first die having a second surface disposed in the first plane of the leadframe; and
    mounting a second die to the first surface of the first die.

17. The method of claim 16, wherein the second die includes a leaded package, nonleaded package, array package, flip chip die, or passive component.

18. The method of claim 16, further including forming an encapsulant over a portion of the elevated die paddle for structural support.

19. The method of claim 16, further including disposing an underfill material between the first die and second die for structural support.

20. The method of claim 16, further including forming an opening through the central area of the die paddle, the first die being mounted over the opening to support the first die within the semiconductor package, the second die being disposed within the opening.

21. The method of claim 20, further including mounting the second die within the opening using a ball grid array or wire bond.

* * * * *